(12) United States Patent
Green et al.

(10) Patent No.: US 8,649,183 B2
(45) Date of Patent: Feb. 11, 2014

(54) ELECTRONIC ASSEMBLY

(75) Inventors: Rodney Austin Green, Donnybrook (AU); Kevin Craig Bellette, Wagin (AU); Perry Arthur Kelly, Gosnells (AU)

(73) Assignee: Mulpin Research Laboratories, Ltd., Cannington (AU)

( * ) Notice: Subject to any disclaimer, the term of this patent is extended or adjusted under 35 U.S.C. 154(b) by 347 days.

(21) Appl. No.: 13/024,818

(22) Filed: Feb. 10, 2011

(65) Prior Publication Data

US 2012/0205147 A1 Aug. 16, 2012

(51) Int. Cl.
*H05K 1/18* (2006.01)
(52) U.S. Cl.
USPC .......................................... 361/761; 174/260
(58) Field of Classification Search
USPC .................... 361/761–764; 174/260, 262–266
See application file for complete search history.

(56) References Cited

U.S. PATENT DOCUMENTS

| | | | |
|---|---|---|---|
| 6,031,723 A * | 2/2000 | Wieloch | 361/719 |
| 6,117,707 A | 9/2000 | Badehi | 438/113 |
| 6,324,067 B1 * | 11/2001 | Nishiyama | 361/761 |
| 6,440,770 B1 * | 8/2002 | Banerjee et al. | 438/106 |
| 6,664,484 B2 | 12/2003 | Haba et al. | 174/261 |
| 7,719,121 B2 | 5/2010 | Humpston et al. | 257/784 |
| 7,741,566 B2 | 6/2010 | Johnson | 174/262 |
| 2007/0223935 A1 | 9/2007 | Asai et al. | 398/164 |
| 2008/0041619 A1 | 2/2008 | Lee et al. | 174/260 |
| 2009/0279274 A1 | 11/2009 | Agnew et al. | 361/803 |
| 2010/0128411 A1 | 5/2010 | Onishi et al. | 361/302 |
| 2010/0135611 A1 | 6/2010 | Asai et al. | 385/14 |
| 2010/0149768 A1 | 6/2010 | Takaike | 361/761 |

FOREIGN PATENT DOCUMENTS

TW   I220643   8/2004

OTHER PUBLICATIONS

International Search Report dated Mar. 14, 2012 issued in PCT International Application No. PCT/AU2012/000123.

* cited by examiner

*Primary Examiner* — Jeremy Norris
(74) *Attorney, Agent, or Firm* — Joseph Stecewycz

(57) ABSTRACT

An electronic assembly that includes a circuit board having a substrate in which an open space is defined, and a component having a housing and a plurality of leads, the open space being large enough to receive the housing of the component at least partially.

21 Claims, 10 Drawing Sheets

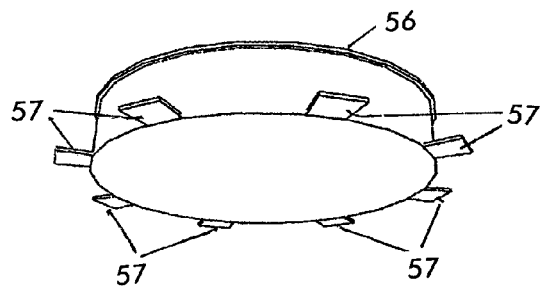 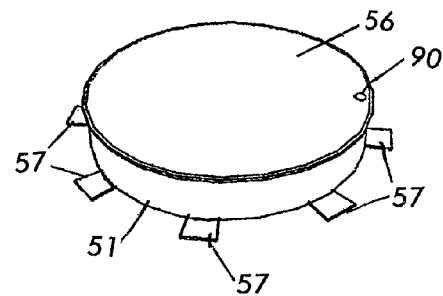
FIG. 5A    FIG. 5B
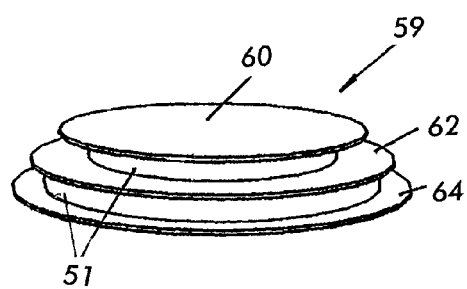 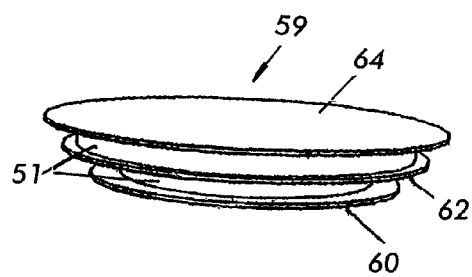
FIG. 6A    FIG. 6B
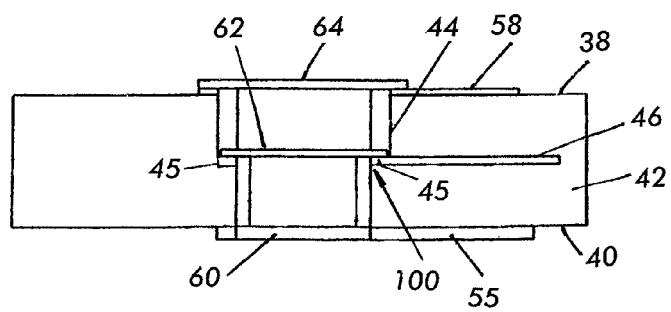
FIG. 6C

ELECTRONIC ASSEMBLY

FIELD OF THE INVENTION

The present invention relates to practical electronic circuits and more particularly to an electronic assembly.

BACKGROUND OF THE INVENTION

A typical electronic circuit includes a plurality of electronic devices that are interconnected to one another via conductive buses/traces on a surface of a dielectric substrate. The combination of the buses/traces and the substrate is called a circuit board.

A known circuit board includes conductive buses/traces on a top surface thereof as well as buses/traces embedded in the body of its substrate. To reach the embedded buses vias are typically used. A via is a conductive filled or conductive clad cavity defined in the substrate. In a typical arrangement, the conductive body residing in a via extends between an embedded bus and an exterior surface of the substrate. A component mounted on the exterior surface can be electrically connected to the embedded bus via an electrical connection to the conductive body inside the via.

The conductive body inside a via adds to the length of the conductive path between the components of an electronic assembly resulting in increased inductance in the connection path. Thus, the use of vias may lead to increased impedance particularly in high frequency applications.

In this arrangement, connections to the embedded buses and traces are required. Such connections are typically made outside the substrate to a contact on the bus/trace that is placed on the exterior surface of the substrate. Exposure of the conductive body at the exterior of the substrate may make the circuit including the body more readily subject to electrical interference.

SUMMARY OF THE INVENTION

It is an object of the present invention to provide an electronic assembly.

It is another object of the present invention to provide an electronic assembly that embodies shorter interconnection paths between the components to realize lower overall inductance, a smaller footprint and possibly reduced height.

It is a further object of the present invention to provide an electronic assembly that embodies an arrangement that allows for the reduction of the deleterious effects caused by electromagnetic interference between the components on the printed circuit board and to components in other nearby circuits.

It is another object of the present invention to provide an electronic assembly that embodies an arrangement for better management of heat generated by components of the assembly.

An electronic assembly according to the present invention includes a circuit board that comprises a substrate having a first outermost surface and a second outermost surface that is spaced from the first outermost surface, an open space defined in the substrate, the open space being accessible through an opening residing at at least one of the outermost surfaces, an electronic connection pad in the substrate which is accessible via the open space, and a component including a first lead, a second lead and a housing or support, the housing being at least partially received in the open space and the first lead having a connection surface that is electrically coupled to the electronic connection pad in the substrate.

According to an aspect of the present invention the connection pad is positioned so that any electromagnetic interference emitted from the connection surface is at least partially intercepted by the substrate.

According to another aspect of the present invention the second lead is coupled to a conductive body disposed on the outermost surface with access to the open space, whereby heat generated from the electronic device is spread and dissipated by the conductive body.

A component suitable for an assembly according to the present invention may be constructed in many different ways. For example, the leads of the component may terminate at an exterior surface of the housing, or may extend beyond an exterior surface of the housing, or may be arranged laterally spaced from one another and coplanar, or may be spaced and non-coplanar, or may be arranged at terminal ends, e.g. top and bottom, of the housing. At least one of the leads of the component may serve as a heat spreader or may be configured to be electrically coupled to a corresponding pad on the first outermost surface of the circuit board.

In another aspect, for example, the housing of the component may be cylindrical, and include annular leads that may be disposed at terminal ends of the housing and have different diameters. Alternatively, one or more of the annular leads may be positioned along the cylinder intermediate the terminal ends, to engage contacts inside the PC board. The annular shape enables contacting the lead at any location around the component.

In a further aspect, the component body may be stepped in diameter, if it is round, or stepped in length and/or width, which eases installation of the component in the PC board.

In addition, the first lead may be a lead in a group of first leads laterally or circumferentially spaced from one another and coplanar in a first plane, and the second lead may be a lead in a group of second leads laterally spaced from one another and coplanar in another plane.

An electronic assembly according to the present invention may include a circuit board that comprises a substrate having a first outermost surface and a second, opposite, outermost surface that is spaced from the first outermost surface. An open space is defined in the circuit board. The open space is accessible through an opening residing in the first outermost surface at least. An electronic connection pad has a connection surface accessible through the opening at the first outermost surface. The connection pad is positioned and configured to mate with a connection surface of a lead of a component. That component has a housing that is dimensioned to be at least partially receivable in the open space. The open space may be accessible through a second opening at the second outermost surface, the second opening may be smaller than the first opening to define a first ledge extending into the open space, the electronic connection pad residing at the first ledge. The substrate of the circuit board may include a second ledge extending into the open space. The second ledge is narrower than the first ledge, wherein another connection pad that is configured for connection to another lead of the component resides at the second ledge.

According to another aspect of the present invention the open space and the component may have complementary shapes. For example, the open space and the housing of the component may be cylindrical. This provides for a preferably tight, secure fit, correctly orients the component and aligns the leads on the component with leads of the substrate(s) of the PC board for mechanical contact and electrical connection.

Other features and advantages of the present invention will become apparent from the following description of the invention which refers to the accompanying drawings.

BRIEF DESCRIPTION OF THE DRAWINGS

FIG. 5A illustrates a bottom perspective view of a component suitable for an assembly according to the fourth embodiment of the present invention.

FIG. 5B illustrates a top perspective view of the component of FIG. 5A.

FIG. 6A illustrates a bottom perspective view of a component suitable for use in an assembly according to a fifth embodiment of the present invention.

FIG. 6B illustrates a top perspective view of the component of FIG. 6A.

FIG. 6C illustrates the component of FIG. 6A received in a circuit board to realize an assembly according to the fifth embodiment of the present invention.

DETAILED DESCRIPTION OF PRIOR ART AND OF THE INVENTION

Hereafter, unless otherwise indicated like numerals identify like features in the Figures.

Figure 1:
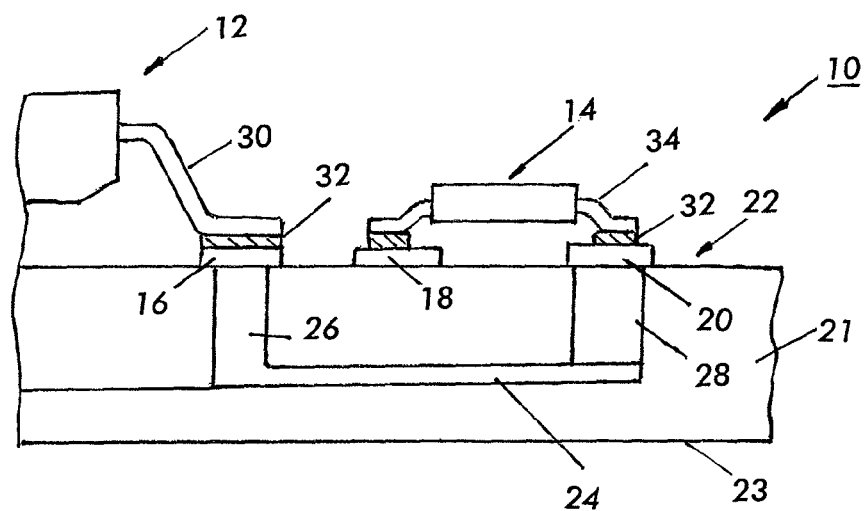
FIG. 1 schematically illustrates an assembly according to the prior art.

Referring to FIG. 1, a practical circuit assembly according to the prior art may include a circuit board 10 and a plurality of electronic components 12, 14 which are electrically connected to one another to realize a portion of an electronic circuit. In the illustrated assembly, a multilayer circuit board is used. A multilayer circuit board includes a substrate 21, which is made from a dielectric (e.g. plastic or ceramic), and a plurality of conductive pads 16, 18, 20 disposed on an outer surface 22 of substrate 21, and a conductive bus/trace 24 buried in the body of substrate 21 between the outer surfaces 22, 23 thereof. Conductive filled vias 26, 28 electrically connect bus 24 to respective conductive pads, e.g. pads 16, 20, on outer surface 22. Thus, a lead 30 of one component 12 may be connected by a layer of conductive adhesive 32 (e.g. solder) to one conductive pad, e.g. pad 16, and electrically connected to lead 34 of another component, e.g. component 14, which is electrically and mechanically coupled to a conductive pad, e.g. pad 20, by a layer of conductive adhesive 32. Leads 30 and 34 are, therefore, electrically connected via a buried bus 24, while components 12, 14 are mounted on an outer surface 22 of circuit board 10.

A conventional arrangement essentially at one level or generally in one plane as illustrated and described above positions the components on the circuit board to require a possibly unnecessary, relatively long electrical connection leading to unnecessary inductance, thus particularly possibly adversely affecting high frequency performance. Furthermore, unshielded leads, e.g. leads 30, 34, as illustrated may emit electromagnetic waves, which in high frequency applications, are problematic and require components to be spaced further apart to avoid negative effects caused by electromagnetic interference (EMI). Further spacing of components may lengthen the interconnection paths between the components further increasing the overall parasitic inductance of the bus lines and traces of the circuit board in a conventional assembly.

Figure 2:
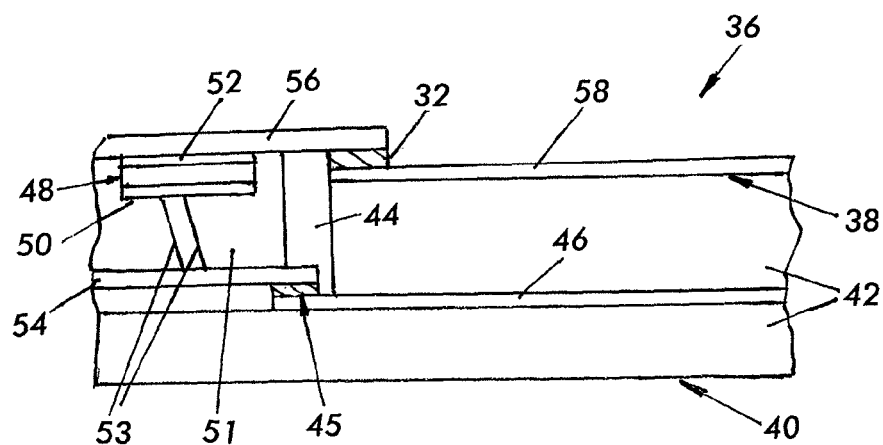
FIG. 2 schematically illustrates an assembly according to a first embodiment of the present invention.

Referring to FIG. 2, in an assembly according to the first embodiment of the present invention, a multilayer circuit board 36 having two opposing outermost surfaces 38, 40 is configured to receive a component in the body of substrate 42 thereof. Specifically, circuit board 36 includes an open space 44 defined in the body of substrate 42 which exposes a portion of a buried bus/trace 46 that may serve as a connection pad 45. Connection pad 45 can be configured for electrical and mechanical connection to a respective lead of a component.

For example, connection pad 45 may be rendered solderable so that it may be configured for electrical and mechanical connection to a lead of a component by a layer of solder. Thus, according to one aspect of the present invention the electrical and mechanical connection to the lead of a component may be made inside the PC board on a plane that is spaced from the plane of first outermost surface 38 and accessible at least through the opening at the first outermost surface that leads into space 44. Note that open space 44 may be a cavity having a closed bottom as illustrated or may be an opening that extends from first outermost surface 38 to second outermost surface 40. In the latter arrangement, connection pad 45 may be located outside of space 44, but accessible for connection through opening 44 as will be illustrated below.

A component that is suitable for an assembly according to the present invention is dimensioned so that it may be at least partially received in the open space 44. FIG. 2 illustrates a partial view of a suitable component that may be used in an assembly according to the present invention. A suitable component for use with an assembly according to the present invention may include an electronic device 48. Electronic device 48 may be an active device, e.g. a MOSFET, an IGBT, an ASIC device or the like, or a passive device such as a diode, a capacitor, a resistor or the like. For illustrative purposes, FIG. 2 shows a vertical conduction diode that includes a first electrode 50 (e.g. cathode electrode) on an obverse surface and a second electrode 52 (e.g. anode electrode) on a reverse surface thereof. First electrode 50 may be electronically connected to a first lead 54 via wirebonds 53, while second electrode 52 is electrically and mechanically coupled to a second lead 56 by a conductive adhesive such as solder. Lead 56 may be then connected electrically and mechanically via a layer of conductive adhesive 32 to a conductive pad or a trace 58 residing on first outermost surface 38 of substrate 42.

Electronic device 48 may be enclosed in a housing 51. Housing 51 may be made with a suitable engineering plastic or a suitable ceramic that is molded around device 48, and adhered to leads 54, 56 as is well known in conventional packaging art. Housing 51 may also be a hollow ring or the like structure without deviating from the scope and spirit of the present invention. Note that in the example illustrated by FIG. 2 leads 54, 56 extend beyond the outer periphery of housing 51, which is a preferred configuration although not critical to the operation of an assembly according to the present invention.

In an assembly according to the present invention, the connection path from device 48 to bus 46 is shortened and a substantial amount of conductive material is omitted whereby parasitic inductance of the assembly is reduced. Furthermore, the location of the connection of the lead (e.g. lead 54) of the component is moved to a location below or between outermost surfaces 38, 40, whereby generated electromagnetic interference may be intercepted and absorbed by substrate 42. Consequently, components and other components may be moved closer to one another using the invention as illustrated in the example of FIG. 2, which may advantageously reduce parasitic inductance by shortening the interconnection paths and may reduce the lateral footprint of the assembly. Moreover, the provision of open space 44 and the at least partial insertion of a component within the body of substrate 42 results in the reduction of the height of the assembly, further reducing the overall size of the component. In addition, the electrical connection of a lead (e.g. lead 56), which is connected to a device 48 can provide a thermal path for the heat that is generated by device 48. The heat so generated can travel through lead 56 and solder body 32 into conductive bus/trace 58 where it is further spread and dissipated, which is another advantage of an assembly according to the present invention.

Figure 3A:
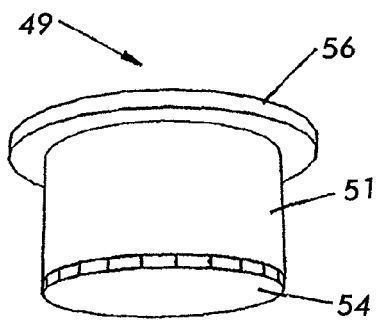
FIG. 3A illustrates a bottom perspective view of a component for an assembly according to a second embodiment of the present invention.
Figure 3B:
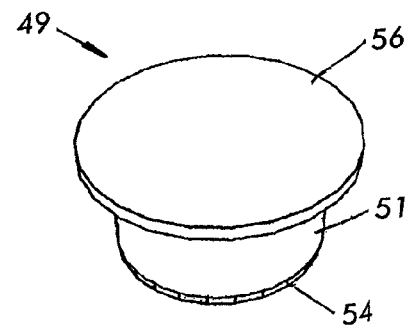
FIG. 3B illustrates a top plan view of the component of FIG. 3A.

FIGS. 3A-3D illustrate an example of an assembly according to the second embodiment of the present invention for a two lead component 49. Referring specifically to FIGS. 3A and 3B, a suitable component 49 may include first and a second disk-shaped, annular leads 54, 56 disposed at opposite terminal ends of a cylindrical housing 51. This embodiment may be used for housing a two terminal electronic device such as a capacitor, a resistor, a diode or the like device. In this embodiment, first lead 54 has a peripheral edge which terminates at the exterior surface of housing 51, while second lead 56 extends beyond the exterior surface of housing 51.

Figure 3C:
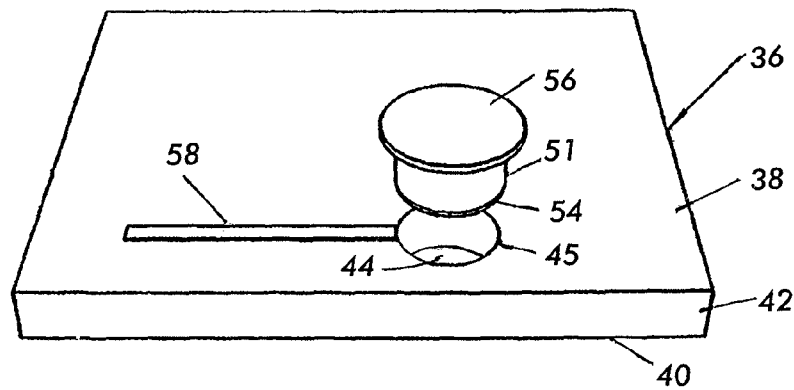
FIG. 3C schematically illustrates a disassembled assembly according to the second embodiment of the present invention.
Figure 3D:
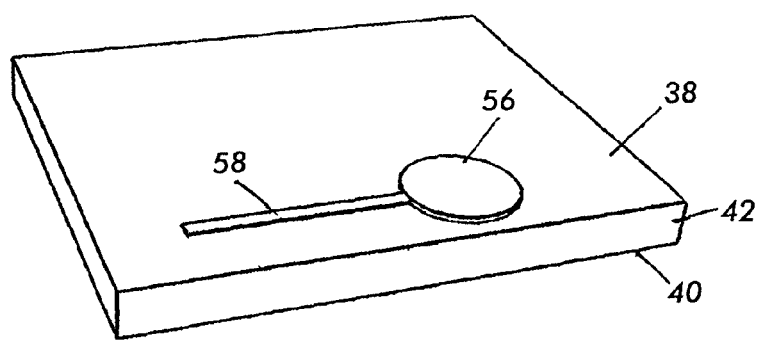
FIG. 3D illustrates a perspective view of an assembly according to the second embodiment of the present invention.

Referring to FIG. 3C, in an assembly according to this second embodiment of the present invention a cylindrical open space 44 is defined in substrate 42 for receiving component 49 at least partially. Specifically, open space 44 is defined large enough to receive at least lead 54 entirely and at least a portion of housing 51. The diameter of the opening 45 at outermost surface 38 leading into open space 44 is smaller than the diameter of second lead 56, whereby, as illustrated by FIG. 3D, the opening at surface 38 that leads into open space 44 is closed by lead 56. Consequently, in the embodiment disclosed by FIGS. 3A-3D, lead 56 would function as a lid for enclosing space 44 further contributing to the reduction of EMI by providing a shield. Note that in this embodiment first lead 54 would be electrically and mechanically coupled to a respective connection pad which is connected to a buried bus/trace as described above and illustrated by FIG. 2. Furthermore, second lead 56 would be electrically and mechanically coupled to trace 58 on first outermost surface 38.

To assure contact between the lead(s) 54, 56 and the trace in or a trace on the substrate, the contacts 54, 56 are of a material, metal, to expand when heated, as occurs when heat is applied to solder connections on or inside the board. The ring(s) may be split to ease that expansion. Solder may be applied at the contact between a contact on a lead and the illustrated annular contact 56 or 58.

Figure 3E:
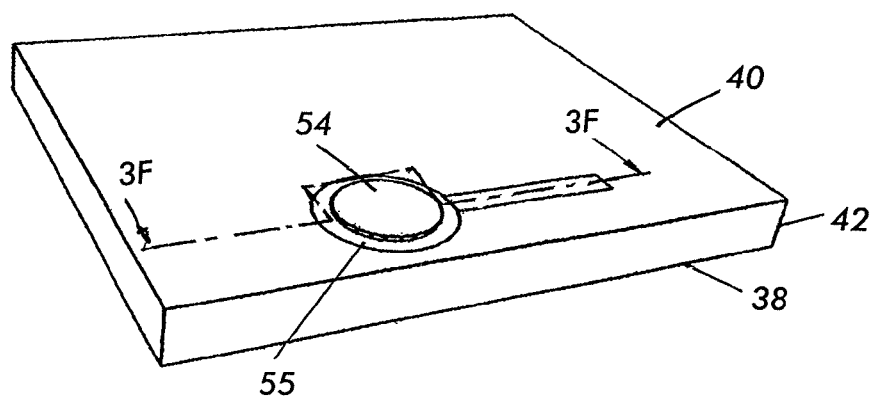
FIG. 3E illustrates a perspective view of a bottom of an assembly according to a variation of the embodiment illustrated by FIG. 3D.

Referring to FIG. 3E, in a variation of the first embodiment, open space 44 may extend all the way through substrate 42. Thus, first lead 54 of component 49 may be exposed through the outermost surface 40 as illustrated. Lead 54 may be then electrically coupled to a conductive pad 55 residing on outermost surface 40 by any suitable method. Consequently, component 49 may enjoy cooling at both leads via connection to pads on both outermost surfaces of the circuit board. To enhance the cooling effect, the pads are of greater diameter than the opening into the open space 44.

Figure 3F:
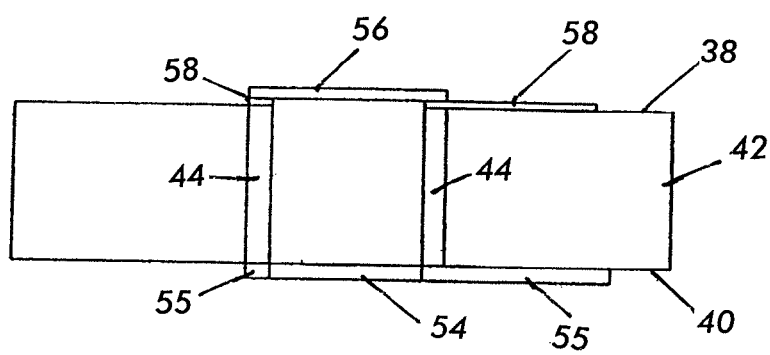
FIG. 3F illustrates cross-sectional view along line 3F-3F in FIG. 3E viewed in the direction of the arrows.

FIG. 3F shows first lead 54 extending through open space 44 and making contact with trace 55 at the periphery thereof. Thus, in this example, first lead 54 may be received in an opening inside trace 55 which includes an annular portion that is sized to fit tightly around outer periphery of lead 54 whereby the two bodies may be electrically connected via a surface to surface contact. Alternatively, lead 54 may be sized so that when it is received inside space 44, there will be a gap between trace 55 and outer periphery of lead 54 that can be filled with a conductive adhesive such as solder to realize an electrical and mechanical connection between lead 54 and trace 55.

Figure 4A:
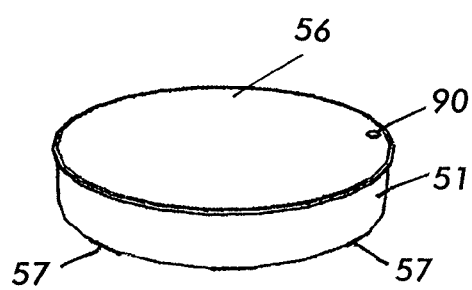
FIG. 4A illustrates a top perspective view of another component suitable for an assembly according to the third embodiment of the present invention.
Figure 4B:
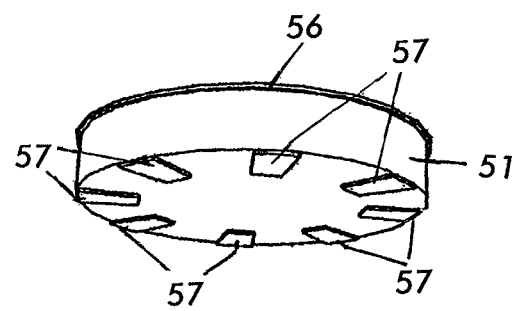
FIG. 4B illustrates a bottom perspective view of the component of FIG. 4A.

Referring to FIGS. 4A-4B, a component suitable for an assembly according to a third embodiment of the present invention may include a plurality of input/output (I/O) leads 57 (e.g. eight leads) and a disk-shaped second lead 56 which may be active electrically (e.g. coupled electrically to an electrode of an electronic device enclosed in housing 51) or inactive (i.e. not electrically connected to an electrode of an electronic device enclosed in housing 51), but still capable of transferring heat from the enclosed electronic device to a pad on a surface of a circuit board as described above.

I/O leads 57 are preferably equally spaced from one another, are exposed through the bottom surface of housing 51 (opposite lead 56), and terminate at the exterior surface of housing 51. Each I/O 57 is preferably electrically coupled to a respective electrode of an electronic device enclosed in housing 51, although it is not necessary to have all I/O leads 57 electrically coupled to electrodes of an electronic device enclosed in housing 51. That is, some I/O leads 57 may be left inactive without deviating from the present invention.

Referring to FIGS. 5A-5B, a fourth embodiment variation of a component suitable for an assembly according to the present invention can include I/O leads 57 that extend laterally away and beyond the exterior surface of housing 51.

Components according to FIGS. 4A-4B and 5A-5B can be assembled in the same manner as a two lead component except that instead of one connection pad a plurality of connection pads can be provided each for electrical connection with a respective first lead.

FIGS. 3A-5B illustrate examples in which the leads of the component are located at opposite ends of a cylindrically shaped housing 51. An assembly according to the present invention, however, is not limited to such an arrangement and may be designed with a component that includes leads disposed at planes that are located between the opposite ends of a housing 51 and/or with a non-cylindrical shape body/housing of the component.

Referring to a fifth embodiment in FIGS. 6A-6B, a component 59 in an assembly according to yet another embodiment of the present invention may have a stepped arrangement including three disk-shaped, annular leads 60, 62, 64, each having a diameter that is different from the other two leads. Thus, first lead 60 may have a diameter that is smaller than the diameters of second and third leads 62, 64, while second lead 62 may have a diameter that is smaller than the diameter of third lead 64, but larger than the diameter of first lead 60. Third lead 64, therefore, would have a diameter that is larger than the diameter of the other two leads 60, 62. Consequently, component 59 would have a stepped profile. Note that in this embodiment, component 59 includes a housing 51 having two cylindrical portions of different diameters, which preferably encloses a three terminal electronic device, such as a MOSFET or an IGBT (not shown). Second lead 62 thus may include an opening therein (not shown) to allow access between first and third leads 60, 64 that can be used for wirebonding of the electrodes of the electronic device inside housing 51 to the leads.

FIG. 6C illustrates component 59 in an assembly according to a fifth embodiment of the present invention. Thus, as illustrated first lead 60 is electrically coupled to a trace 55 on second outermost surface 40 as described above with reference to FIG. 3F, second lead 62 is electrically and mechanically coupled to a buried bus or trace 46 as described above with reference to FIG. 2, and third lead 64 is coupled to a trace 58 on first outermost surface 38 as described above with reference to FIG. 2. Note that because the diameter of the second lead 60 is smaller than the diameter of second lead 62, the diameter of the opening at second outermost surface 40 could be smaller resulting in an annular ledge 100 inside space 44 on which a connection pad 45 resides for connection to second lead 62.

Referring to FIGS. 7A-7D, an assembly according to a sixth embodiment of the present invention may be realized with a component 66 that includes four disk-shaped, annular leads 68, 70, 72, 74. In this embodiment, housing 51 may be cylindrical having a first lead 68 at one end thereof, and a fourth lead 74 at an opposite end thereof. Second lead 70 and third lead 72 are located at the exterior surface of housing 51 each at a position between first lead 68 and fourth lead 74.

Figure 7A:
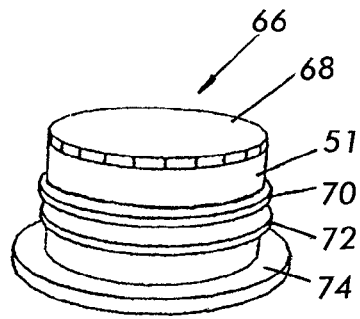
FIG. 7A illustrates a bottom perspective view of a component suitable for use in an assembly according to the sixth embodiment of the present invention.
Figure 7B:
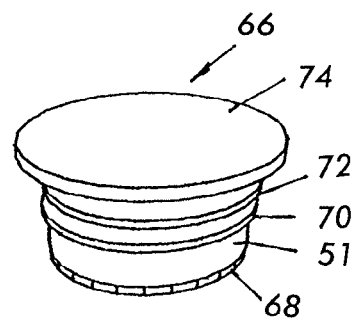
FIG. 7B illustrates a top perspective view of the component of FIG. 7A.
Figure 7C:
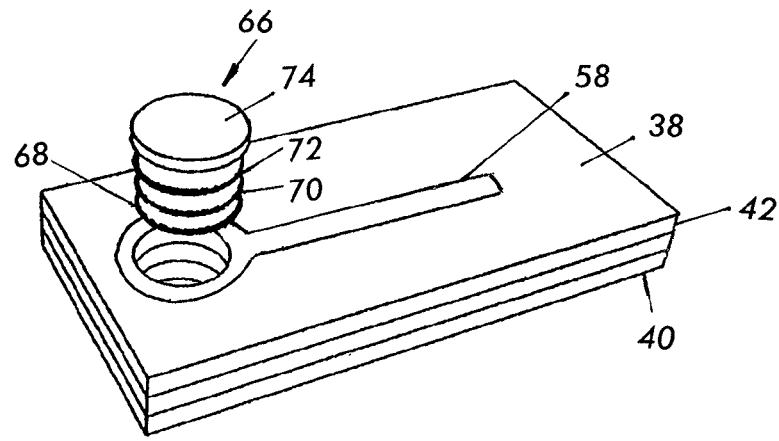
FIG. 7C illustrates a top perspective view of a disassembled assembly according to the sixth embodiment of the present invention.

Referring to FIG. 7C, component 66 is receivable in an open space 44. Conductive pads (not shown here) which are connected to buried buses/traces residing in opening 44 are positioned inside open space 44 to make contact with at least leads 70, 72.

Figure 7D:
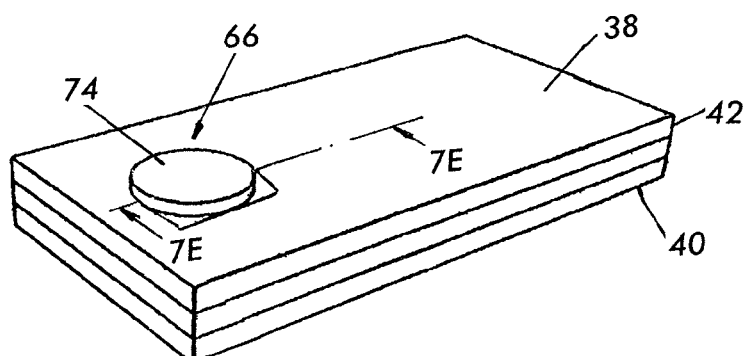
FIG. 7D illustrates a top perspective view of an assembly according to the present invention.
Figure 7E:
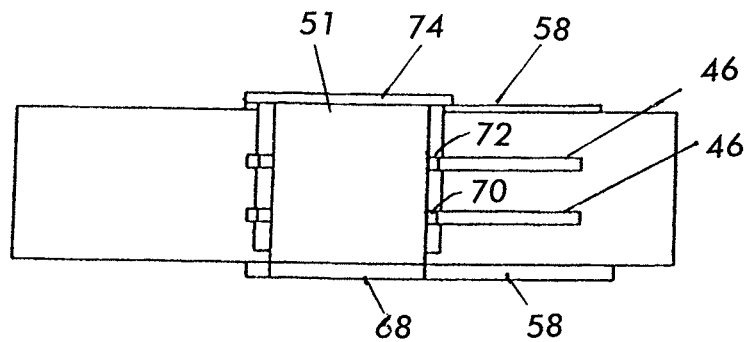
FIG. 7E illustrates a cross-sectional view along line 7E-7E viewed in the direction of the arrows.
Figure 7F:
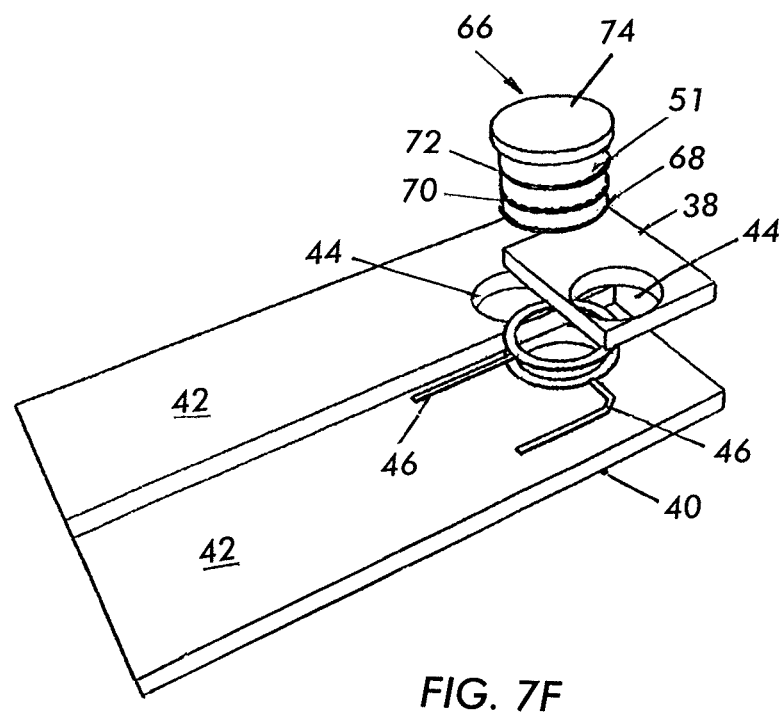
FIG. 7F illustrates a top perspective view of a disassembled circuit board in an assembly according to the sixth embodiment of the present invention.

Referring to FIGS. 7D and 7E, first lead 68 is connected to trace 58 on second outermost surface 40 in the same manner as electrode 54 in the embodiment illustrated by FIG. 3F, and fourth electrode 74 is connected to trace 58 on first outermost surface in the same manner as lead 56 in the embodiment illustrated by FIG. 3F. Second lead 70 and third lead 72 are electrically connected to respective buried leads 46, 46 in the same manner as lead 54 in the embodiment illustrated by FIG. 3F, that is, by surface to surface contact. FIG. 7F illustrates that a circuit board in this embodiment includes two buried buses 46 each including an annular portion disposed around opening 44 for connection to respective leads 70, 72 of the component.

Referring to FIGS. 8A-8D, in an assembly according to the seventh embodiment of the present invention, a component 80 may include a first lead 82 disposed at one end of a cylindrical housing 51 and a fourth lead 84 at an opposite end of housing 51, a group of spaced second leads 86 extending radially away from the exterior surface of housing 51 and a group of spaced third leads 88 extending radially away from the exterior surface of housing 51, the leads in the two groups extending along parallel and spaced apart planes. Thus, in this embodiment, instead of a single second lead or a single third lead, a plurality of second and third leads are provided. Second and third leads may be I/O leads each connected to a respective electrode of an electronic device that is enclosed by housing 51. For example, the electronic device may be a RAM chip that includes 28 electrodes each coupled to one of a second lead 86 or a third lead 88.

Figure 8A:
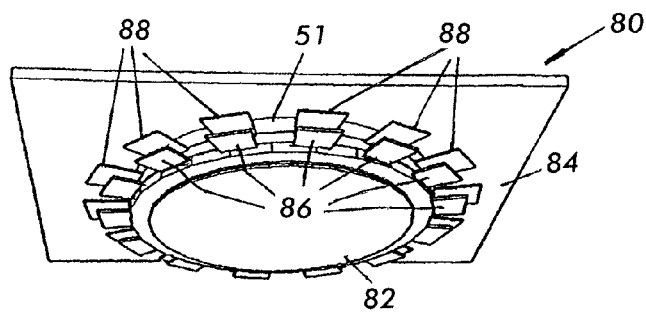
FIG. 8A is a bottom perspective view of a component suitable for use in an assembly according to the seventh embodiment of the present invention.
Figure 8B:
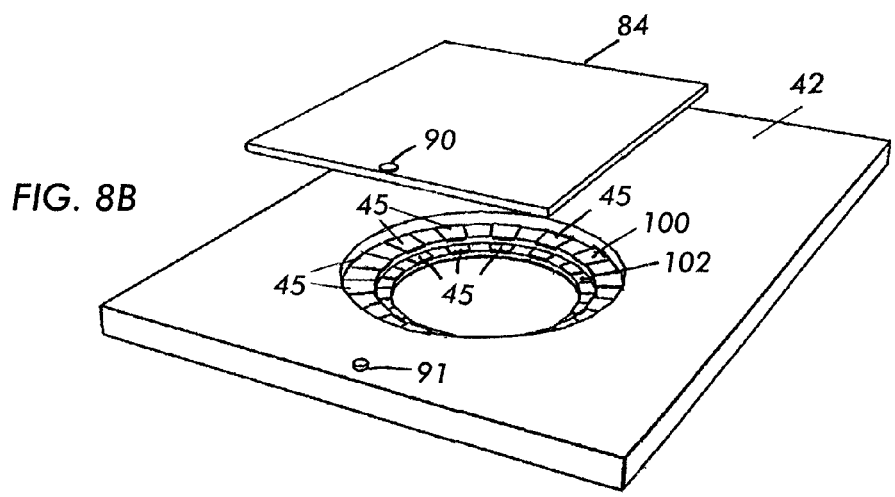
FIG. 8B is a top perspective view of a disassembled assembly according to the seventh embodiment of the present invention.
Figure 8C:
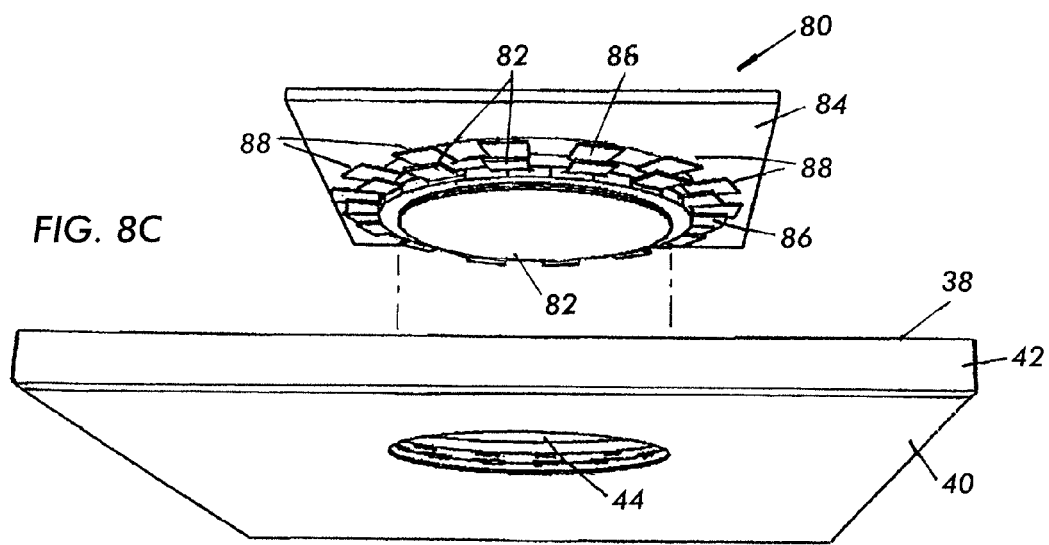
FIG. 8C is a bottom perspective view of a disassembled assembly according to the seventh embodiment of the present invention.
Figure 8D:
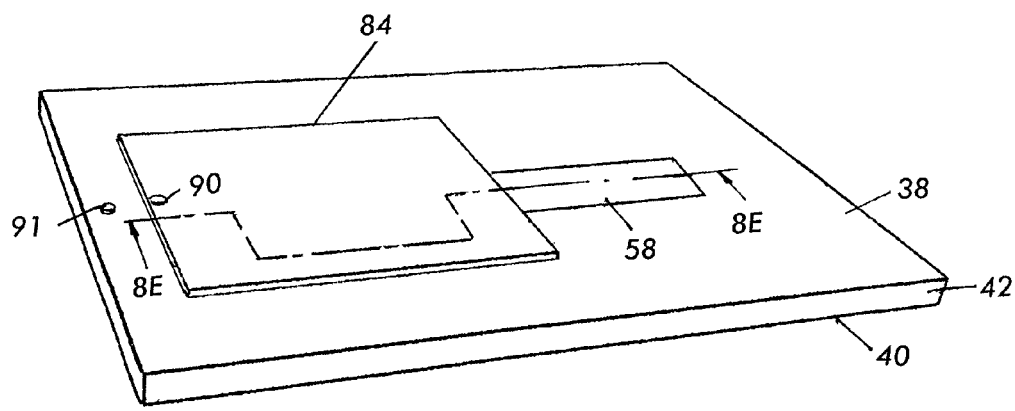
FIG. 8D is a top perspective view of an assembly according to the seventh embodiment of the present invention.
Figure 8E:
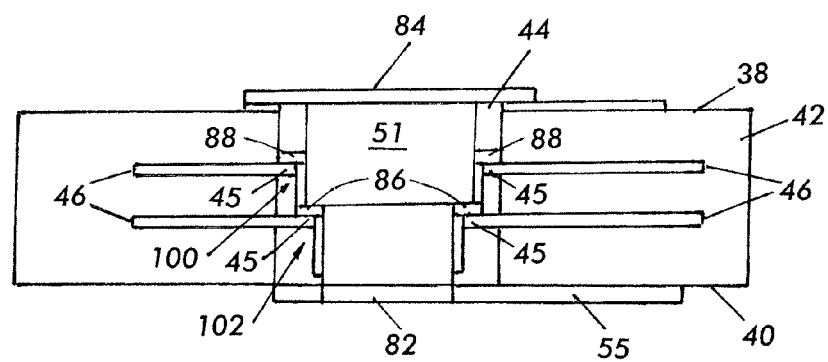
FIG. 8E is a cross-sectional view along line 8E-8E in FIG. 8D viewed in the direction of the arrows.

Referring now to FIGS. 8B and 8C, each one of second leads 86 or third leads 88 is positioned to mate with a respective connection pad 45 residing in open space 44 as illustrated. Thus, each pad 45 would be connected to a respective buried bus or trace inside the body of substrate 42 of the circuit board. Note that because second leads 86 and third leads 88 extend along spaced, parallel planes and are non-coplanar, pads 45 would be arranged in a corresponding manner along parallel, spaced planes that correspond to connection surfaces of second leads 86 and third leads 88. FIG. 8D shows a top perspective view of the assembly. FIG. 8E illustrates that in this embodiment, first lead 82 is connected to trace 55 in the same manner as lead 54 in the embodiment shown by FIG. 3F, while the second and third leads 86, 88 are connected to respective connection pads 45 in the same manner as lead 54 in FIG. 2. Note that in this embodiment two annular ledges 100, 102 are defined inside opening 44.

FIGS. 9A-9D show an assembly according to an eighth embodiment of the present invention, component 81 may be modified to have second leads 86 and third leads 88 that terminate at the exterior surface of housing 51. First lead 82 and fourth lead 84 can have the same configuration as those in component 80 illustrated by FIGS. 8A and 8B. Note that second leads 86 and third leads 88 are arranged to mate with corresponding conductive pads residing inside open space 44. In this embodiment, the pads 45 may reside at the interior wall inside open space 44, whereby when component 81 is inserted inside space 44 each second lead 86 and third lead 88 would make direct contact with a corresponding pad 45 at the interior wall of space 44. The height of the contact ends of leads 86, 88 assures that contact is made with the conductive pads in the open space, even if the component is slightly tilted or seated slightly off from its preset position.

Figure 9A:
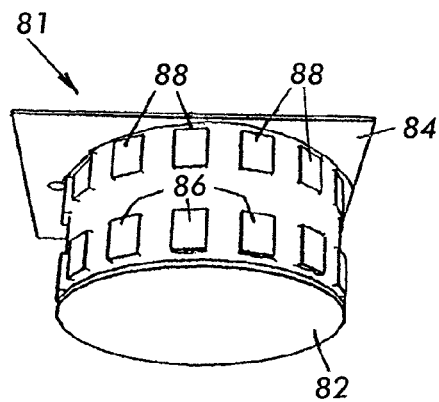
FIG. 9A illustrates a bottom perspective view of a component suitable for an assembly according to an eighth embodiment of the present invention.
Figure 9B:
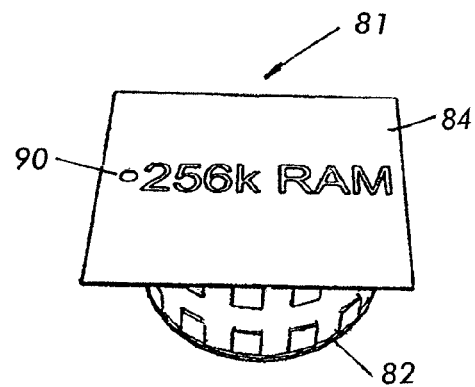
FIG. 9B illustrates a top perspective view of a component of FIG. 9A.
Figure 9C:
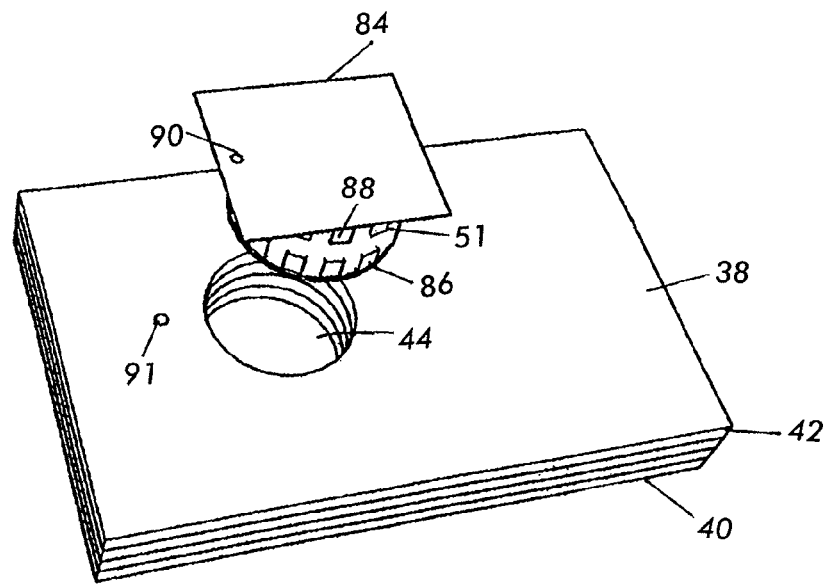
FIG. 9C illustrates a top perspective view of a disassembled assembly according to the eighth embodiment of the present invention.
Figure 9D:
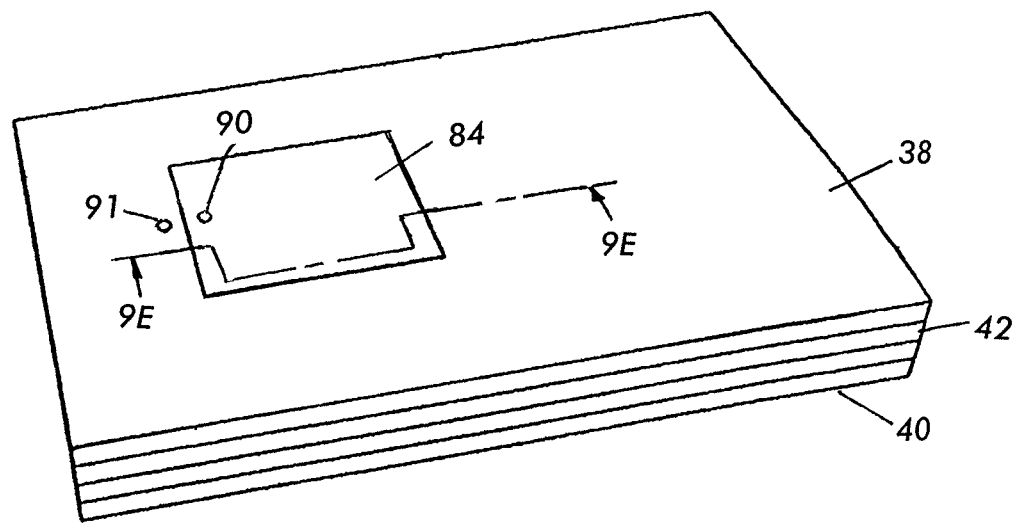
FIG. 9D illustrates a top perspective view of an assembly according to the eighth embodiment.
Figure 9E:
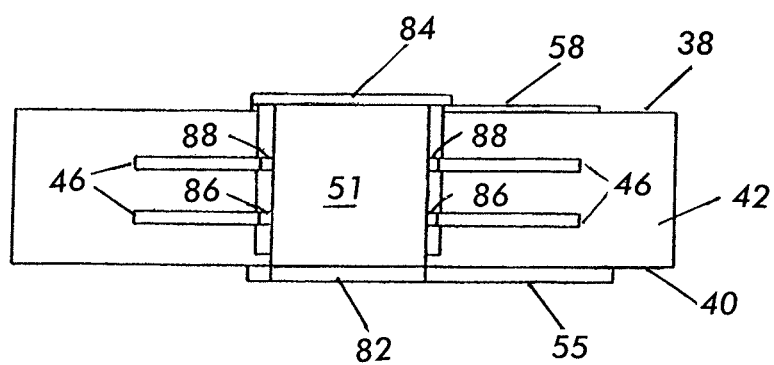
FIG. 9E illustrates a cross-sectional view along line 9E-9E in FIG. 9D viewed in the direction of the arrows.

As illustrated by FIG. 9E, in this embodiment second leads 86 make connection with connection pads 45 of buried bus 46 and third leads make connection with connection pads 45 of buried bus/trace 46 in the same manner as lead 54 in the embodiment illustrated by FIG. 3F, i.e. by surface to surface contact.

The components that include annular leads only enjoy a symmetrical geometry allowing the component to be mounted without regard to the orientation of the component relative to pads 45.

The components that include a plurality of spaced leads may be provided with an indicator 90 (e.g. a dot) that can be aligned with another indicator 91 on the circuit board so that the leads can be aligned with pads 45 properly.

In addition, in an assembly according to the present invention components with a cylindrical housing may be preferred as such components may be conveniently received in a cylindrical open space that can be defined in an FR4 or the like substrate using a conventional method such as drilling by a tungsten carbide tipped drill. However, it should be understood that an assembly according to the present invention is not limited to components with a cylindrical housing. Thus, for example, a component with a cubical housing may be used in an assembly according to the present invention. Such a component may be received in a complementary open space, i.e. a cubical space, that is defined in a substrate employing conventional methods such as punching or the like to realize an assembly according to the present invention.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An electronic assembly comprising:
   a substrate having a first outermost surface and a second outermost surface spaced from said first outermost surface, said first outermost surface including an opening extending into said substrate to define an open space;
   an electronic connection pad disposed within said open space; and
   a component including a first lead, a second lead and a housing, said component being at least partially disposed within said open space such that said first lead is electrically coupled to said electronic connection pad, and such that said second lead is coupled to a conductive body disposed on said first outermost surface whereby said opening is closed by said second lead.

2. The assembly of claim 1, wherein said first lead terminates at an exterior surface of said housing.

3. The assembly of claim 1, wherein said first lead extends beyond an exterior surface of said housing.

4. The assembly of claim 1, wherein said first lead and said second lead are arranged laterally spaced from one another and are coplanar.

5. The assembly of claim 1, wherein said first lead and said second lead are spaced from one another and are non-coplanar.

6. The assembly of claim 1, wherein said housing has opposite terminal ends and said first lead and said second lead are arranged at said terminal ends of said housing.

7. The assembly of claim 1, wherein at least one of said first lead and said second lead is configured to serve as a heat spreader.

8. The assembly of claim 1, wherein said second lead is configured to be electrically coupled to a corresponding pad on said first outermost surface.

9. The assembly of claim 1, wherein said housing is cylindrical.

10. The assembly of claim 9, wherein said housing has opposite terminal ends and said first lead and said second lead are arranged at terminal ends of said housing.

11. The assembly of claim 1, wherein at least one of said first lead and said second lead is annular around said housing and external to said housing to enable contact anywhere around an annular pad.

12. The assembly of claim 1, wherein each of said first lead and said second lead is annular, said first lead having a larger diameter than said second lead.

13. The assembly of claim 1, wherein said first lead is a lead in a group of first leads laterally spaced from one another and coplanar, and said second lead is a lead in a group of second leads laterally spaced from one another and coplanar, said group of first leads and said group of second leads being non-coplanar.

14. An electronic assembly suitable for mounting an electronic component with a component lead, said electronic assembly comprising:
   a substrate having a first outermost surface and a second outermost surface spaced from said first outermost surface;
   an opening in said first outermost surface extending into said substrate to define an open space therein; and
   an electronic connection pad disposed within said open space and configured to electrically couple with the component, the component being dimensioned to be mounted in said open space such that said opening is closed by the component lead.

15. The assembly of claim 14 further comprising a second opening in said second outermost surface, said open space being accessible through said second opening.

16. The assembly of claim 15 further comprising a first ledge extending into said open space, said second opening being smaller than said first opening to define said first ledge, said electronic connection pad disposed on said first ledge.

17. The assembly of claim 15, further comprising a second ledge narrower than said first ledge, and a second electronic connection pad disposed on said second ledge, said second electronic connection pad being configured for electrically coupling said second electrical connection to said component.

18. The assembly of claim 14, wherein said opening is round.

19. The assembly of claim 14, wherein said open space and said component have complementary shapes.

20. The assembly of claim 14, wherein said open space is cylindrical.

21. An electronic component suitable for mounting on a substrate, said electronic component comprising:
   a first lead;
   a second lead; and
   a housing configured for mounting within an open space in the substrate, the substrate having an opening in an outermost surface of the substrate, said opening extending into the substrate to define said open space, said second lead configured to close said opening.

* * * * *